(12) United States Patent
Quddus et al.

(10) Patent No.: US 8,168,466 B2
(45) Date of Patent: May 1, 2012

(54) SCHOTTKY DIODE AND METHOD THEREFOR

(75) Inventors: Mohammed Tanvir Quddus, Chandler, AZ (US); Shanghui L. Tu, Phoenix, AZ (US); Antonin Rozsypal, Hutisko-Solanec (CZ); Zia Hossain, Tempe, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 702 days.

(21) Appl. No.: 11/757,222

(22) Filed: Jun. 1, 2007

(65) Prior Publication Data
US 2008/0299751 A1 Dec. 4, 2008

(51) Int. Cl.
*H01L 21/00* (2006.01)

(52) U.S. Cl. .......... 438/92; 438/140; 438/237; 438/570; 257/E21.358; 257/E21.359

(58) Field of Classification Search .................. 438/571, 438/92, 140, 167, 197, 237, 570
See application file for complete search history.

(56) References Cited

U.S. PATENT DOCUMENTS

| | | | |
|---|---|---|---|
| 4,035,907 A * | 7/1977 | Allen et al. | 438/534 |
| 4,220,961 A * | 9/1980 | Werner | 257/73 |
| 4,311,532 A * | 1/1982 | Taylor | 438/204 |
| 4,333,100 A * | 6/1982 | Morcom et al. | 257/479 |
| 4,899,199 A | 2/1990 | Gould | |
| 5,072,287 A * | 12/1991 | Nakagawa et al. | 257/500 |
| 5,109,256 A * | 4/1992 | De Long | 257/476 |
| 5,171,699 A * | 12/1992 | Hutter et al. | 438/206 |
| 5,204,541 A * | 4/1993 | Smayling et al. | 257/138 |
| 5,418,185 A | 5/1995 | Todd et al. | |
| 5,475,273 A * | 12/1995 | Paparo et al. | 327/545 |
| 5,491,105 A * | 2/1996 | Smayling et al. | 438/268 |
| 5,498,554 A * | 3/1996 | Mei | 438/200 |
| 5,714,921 A * | 2/1998 | Aoki | 335/213 |
| 5,751,022 A * | 5/1998 | Yasuhara et al. | 257/133 |
| 5,804,849 A * | 9/1998 | Wennekers | 257/280 |
| 5,886,383 A | 3/1999 | Kinzer | |
| 6,121,122 A * | 9/2000 | Dunn et al. | 438/583 |
| 6,303,961 B1 * | 10/2001 | Shibib | 257/335 |
| 6,613,633 B2 * | 9/2003 | Oh | 438/268 |
| 6,642,599 B1 * | 11/2003 | Watabe et al. | 257/509 |
| 6,784,489 B1 * | 8/2004 | Menegoli | 257/343 |
| 6,917,081 B2 * | 7/2005 | Ueda et al. | 257/368 |
| 6,974,753 B2 * | 12/2005 | Beasom | 438/306 |
| 7,002,187 B1 | 2/2006 | Husher | |
| 7,019,377 B2 * | 3/2006 | Tsuchiko | 257/476 |
| 7,056,798 B2 * | 6/2006 | Shimotsusa et al. | 438/301 |
| 7,064,407 B1 * | 6/2006 | Mallikarjunaswamy | 257/471 |
| 7,282,386 B2 * | 10/2007 | Khemka et al. | 438/92 |
| 7,355,260 B2 * | 4/2008 | Khemka et al. | 257/471 |
| 7,417,265 B2 * | 8/2008 | Rozsypal | 257/109 |
| 7,608,907 B2 * | 10/2009 | Mallikarjunaswamy | 257/476 |
| 2003/0157756 A1 * | 8/2003 | Beasom | 438/197 |
| 2005/0145975 A1 * | 7/2005 | Kumagai et al. | 257/493 |
| 2005/0253216 A1 * | 11/2005 | Tsuchiko | 257/491 |
| 2006/0202254 A1 * | 9/2006 | Lai et al. | 257/315 |
| 2006/0211227 A1 * | 9/2006 | Chen et al. | 438/570 |
| 2006/0249759 A1 * | 11/2006 | Morris | 257/286 |
| 2007/0108534 A1 * | 5/2007 | Nowak | 257/382 |
| 2007/0181909 A1 * | 8/2007 | Rozsypal | 257/109 |
| 2008/0217725 A1 * | 9/2008 | Tu et al. | 257/484 |

* cited by examiner

*Primary Examiner* — Savitr Mulpuri
(74) *Attorney, Agent, or Firm* — Robert F. Hightower

(57) ABSTRACT

In one embodiment, a Schottky diode is formed on a semiconductor substrate with other semiconductor devices and is also formed with a high breakdown voltage and a low forward resistance.

17 Claims, 2 Drawing Sheets

US 8,168,466 B2

SCHOTTKY DIODE AND METHOD THEREFOR

BACKGROUND OF THE INVENTION

The present invention relates, in general, to electronics, and more particularly, to methods of forming semiconductor devices and structure.

In the past, the semiconductor industry utilized various methods and structures to form Schottky diodes. As the ability to integrate various components on a single integrated circuit increased, it became desirable to integrate Schottky diodes onto semiconductor substrates with other semiconductor components. Examples of such Schottky diodes are provided in U.S. Pat. No. 5,418,185 issued to Todd et al on May 23, 1995, and U.S. Pat. No. 7,019,377 issued to Hideaki Tsuchiko on Mar. 28, 2006. In some applications, it was desirable to have Schottky diodes that had a high breakdown voltage, a low forward resistance, and a low forward voltage. However, it was extremely difficult to integrate a Schottky diode onto a semiconductor substrate and still provide both a high breakdown voltage (for example 500 V or greater), a low forward voltage, and a low forward resistance (for example less than about 100 ohms).

Accordingly, it is desirable to integrate a Schottky diode onto a semiconductor substrate with other semiconductor components and to form the Schottky diode with a high breakdown voltage and a low forward resistance.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. For clarity of the drawings, doped regions of device structures are illustrated as having generally straight line edges and precise angular corners. However, those skilled in the art understand that due to the diffusion and activation of dopants, the edges of doped regions generally may not be straight lines and the corners may not be precise angles.

DETAILED DESCRIPTION OF THE DRAWINGS

Figure 1:
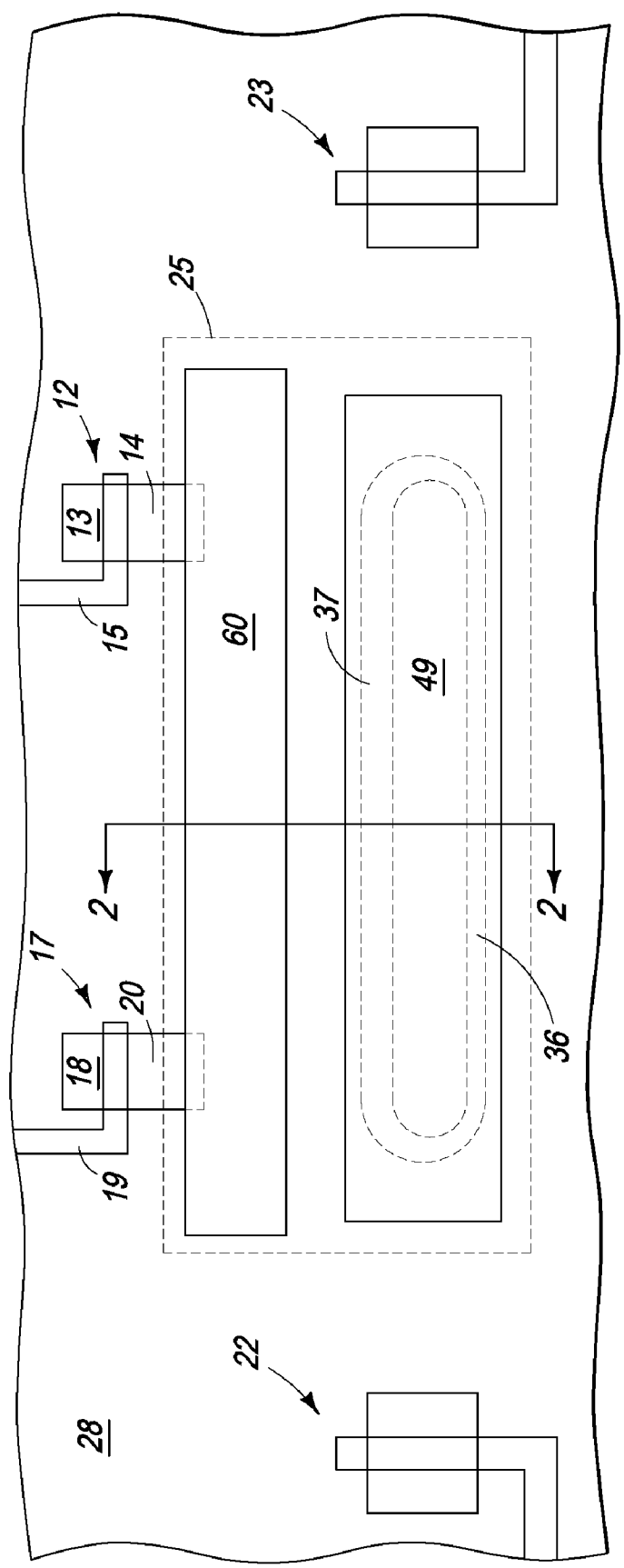
FIG. 1 illustrates an enlarged plan view of an embodiment of a portion of a semiconductor device that includes a Schottky diode in accordance with the present invention.

FIG. 1 schematically illustrates an enlarged plan view of a portion of an exemplary form of an integrated circuit 10 that includes a Schottky diode 25. Diode 25 is integrated onto a semiconductor substrate 28 with other semiconductor components such as MOS transistors 12 and 17. Transistors 12 and 17 are illustrated in simplified form for clarity of the drawings. MOS transistor 12 includes a source region 13 and a drain region 14 that are formed as doped portions of substrate 28, and also includes an MOS gate 15. Similarly, MOS transistor 17 includes a source region 18 and a drain region 20 that are formed as doped portions of substrate 28, and includes an MOS gate 19. In the preferred embodiment, transistors 12 and 17 including drain regions 14 and 20 are formed as a portion of a region 29 (FIG. 2) of diode 25. Other transistors such as MOS transistors 22 and 23 may also be formed on other portions of substrate 28.

Figure 2:
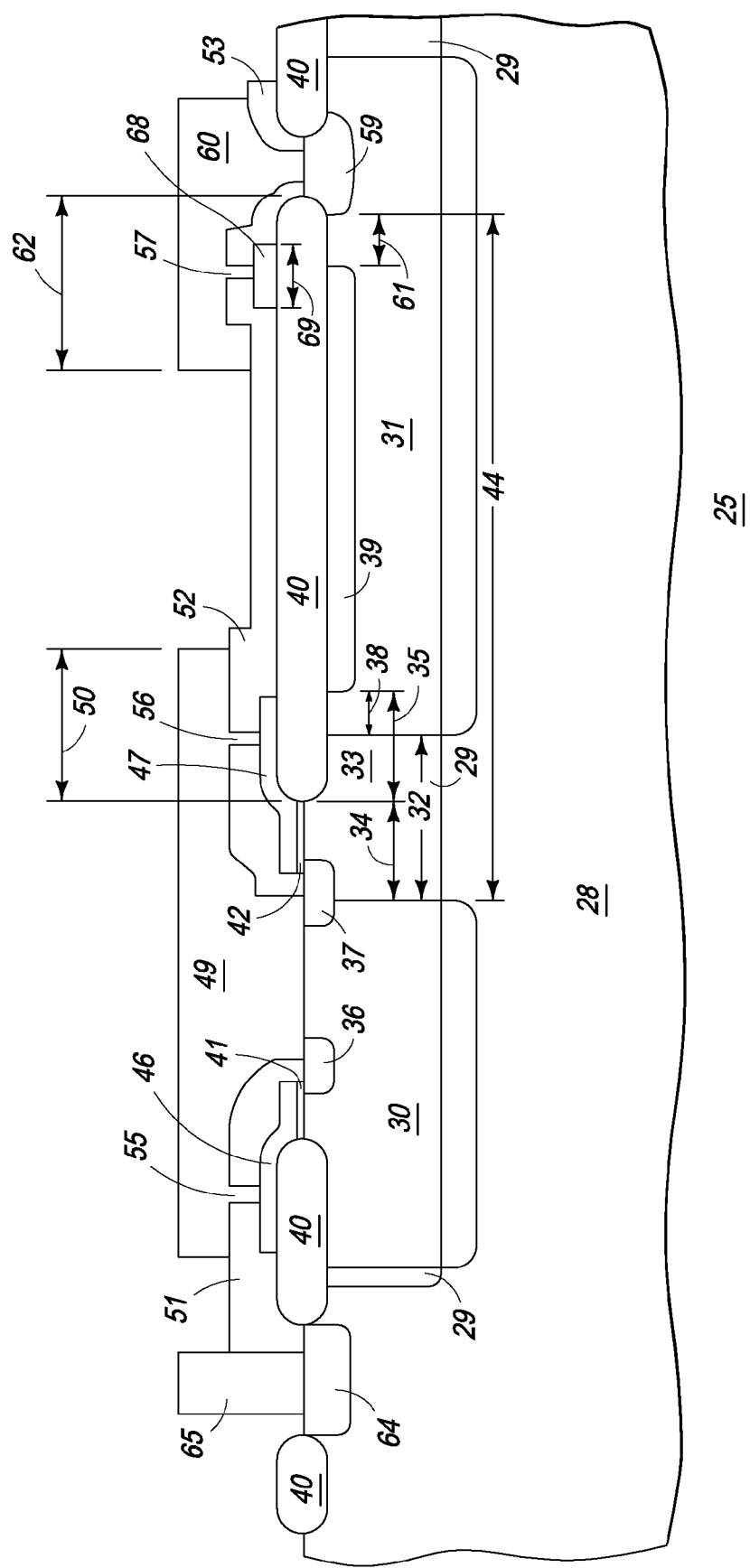
FIG. 2 illustrates an enlarged cross-sectional view of a portion of the Schottky diode of FIG. 1 in accordance with the present invention.

FIG. 2 illustrates an enlarged cross-sectional view of diode 25 along cross-section lines 2-2 that are illustrated in FIG. 1. Diode 25 is formed to have a high breakdown voltage that generally is greater than approximately five hundred volts (500 V). Substrate 28 on which diode 25 is formed generally is formed as a lightly doped P-type substrate that has a doping concentration in the range of $1-5\times10^{14}$ atoms/cm$^3$. The light doping of substrate 28 facilitates forming other types of semiconductor devices, such as transistors 22 and 23, on substrate 28 along with diode 25. An N-type doped region 29 is formed to extend into substrate 28 from the surface of substrate 28. The doping concentration of region 29 generally is about $1-2\times10^{15}$ atoms/cm$^3$. Diode 25 also includes N-type doped regions 30 and 31 generally are formed to overlap respective first and second portions of region 29. Regions 30 and 31 are formed with a doping concentration that is greater than the doping concentration of region 29 and are spaced apart by a distance 32. Regions 30 and 31 generally extend trough region 29 into substrate 28. A portion 33 of region 29 extends between regions 30 and 31 for distance 32. The combination of the different doping concentration between region 29 to regions 30 and 31 along with distance 32 assists in increasing the breakdown voltage and reducing the forward resistance of diode 25. An anode conductor 49 is formed on the surface of substrate 28 and in electrical contact with at least a portion of region 30 in order to form a Schottky junction along the interface of conductor 49 and region 30. Conductor 49 functions as the anode of diode 25 while the cathode is formed by regions 30, 29, 31, and through an ohmic contact to a conductor 60. P-type guard rings are formed as doped regions 36 and 37 extending from the surface into substrate 28 and into region 30. The guard rings of regions 36 and 37 extend along the outside edges of the Schottky junction and reduce the electric field at the edge of the Schottky junction thereby assisting in increasing the breakdown voltage. As can be seen from the plan view of FIG. 1, doped regions 36 and 37 generally are one continuous doped region that surrounds the outside edges of the Schottky junction formed at the interface between conductor 49 and region 30. Typically, regions 36 and 37 overlap the outside interface between conductor 49 and region 30 in order to assist in improving the breakdown voltage of diode 25. The doping concentration of regions 36 and 37 usually is greater than the doping concentration of regions 30 and 31 which forms a junction that assists in reducing the electric field at the edge of the Schottky junction. A P-type doped region 39 is formed within region 31 to also assist in increasing the breakdown voltage of diode 25. The doping concentration of region 39 generally is greater than the doping concentration of regions 30 and 31 to also assist in increasing the breakdown voltage. The charge of region 39 is generally about one-half the charge of region 31. The width of region 39 generally has a width that is less than the width of region 31 so that region 39 is spaced a distance 61 from region 59 and also spaced a distance 38 from an opposite edge of region 31. These spacings also assist in increasing the breakdown voltage. Field oxides 40 are formed on the surface of substrate 28. One portion of field oxide 40 is formed to extend from region 59 to an exterior or distal edge of region 31. A second portion of field oxide 40 extends from region 59 across the surface of substrate 28 overlying regions 31 and 39 past an interior edge of region 31. A third portion of field oxide 40 extends from outside the distal edge of regions 29 and 30 to extend to overlie at least a portion of region 30 that is adjacent to the distal edge. A thin insulator 41 is formed to extend between an edge of region 36 and the edge of oxide 40 that is near region 36. A conductor 46 is formed on insulator 41 and a portion of conductor 46 may overlie a portion of oxide 40. Insulator 41 and the portion of conductor 46 overlying insulator 41 form an MOS gate. Another thin insulator 42 that is similar to insulator 41 overlies the portion of region 29 that extends from region 37 to an edge of the portion of oxide 40 that is adjacent to region 31. Another conductor 47 is formed on insulator 42 and a portion may overlay onto oxide 40. The portion of conductor 47 overlying insulator 42 forms another MOS gate. As will be seen further hereinafter, the MOS gates assist in improving both the breakdown voltage and the forward resistance of diode 25. Those skilled in the art will appreciate that insulators 41 and 42 do not have to overlie the entire distance between oxides 40 and the respective regions 36 or 37. For example, the distance between region 36 and the adjacent oxide 40 may be much smaller than the distance between region 37 and the adjacent oxide 40, thus, insulator 41 and the MOS gate resulting therefrom may be much shorter than insulator 42 and the MOS gate resulting therefrom. An insulator material is applied to the surface of substrate 28 and patterned to form an inner-layer dielectric that includes inner-layer dielectrics 51, 52, and 53. Dielectric 51 and a portion of dielectric 52 insulate anode conductor 49 from conductors 46 and 47 and another portion of dielectric 52 along with dielectric 53 insulate conductor 60 from other portions of diode 25. A conductor 68 is formed on a portion of oxide 40 to form an MOS capacitor overlying at least a portion of distance 61. Conductor 68 has a length 69 and is positioned near an adjacent edge of region 59 to assist in improving the breakdown voltage. Feed-throughs 55, 56, and 57 provide an electrical connection between conductor 49 and conductors 46, 47, and between conductors 60 and 68, respectively, in order to provide an electrical potential to the MOS gates and the MOS capacitor. A heavily doped region 64 is formed on substrate 28 in order to form an ohmic contact to substrate 28. A conductor 65 provides a connection to substrate 28 through region 64.

When diode 25 is forward biased, the MOS gates receive the voltage from conductor 49. The voltage applied to the MOS gate that includes insulator 42 forms an accumulation area within portion 33 of region 29 and near the surface thereof. The accumulation area assists in conducting current from region 30 across the portion of region 29 that is between regions 30 and 31. The current flow continues from region 29 through region 31 to region 59 and conductor 60. The low resistance of regions 30 and 31 in addition to the accumulation area assist in keeping the forward resistance of diode 25 low. Thus, even though a portion of region 29 separates regions 30 and 31, the accumulation area helps to reduce the forward resistance. The drift region of diode 25 extends from an edge of region 59 through region 31 through the portion of region 29 that is between regions 30 and 31, as illustrated by a distance 44, and through region 30 to the edge of the Schottky junction. Note that an accumulation area is also formed under insulator 41 but it has a minimal effect on current conduction.

When diode 25 is reversed biased, several of the features of diode 25 combine to assist in increasing the breakdown voltage of diode 25. Under reverse bias conditions, the connection to conductor 49 ensures that the accumulation areas underlying the MOS gates will not be formed under insulators 41 and 42, but that the areas will be depleted. Thus, the MOS gates assist in increasing the breakdown voltage of diode 25. The reverse voltage applied to diode 25 expands the P-N junctions formed between substrate 28 and regions 29, 30, 31 thereby forming depletion regions that spread the electric field and assist in increasing the breakdown voltage. Spacing the cathode electrode, formed by region 59 and conductor 60, distance 44 from the anode electrode formed by conductor 49 also spreads the electric field over distance 44 and increases the breakdown voltage. Spacing region 39 distance 61 from region 59 and distance 35 from the edge of oxide 40 minimizes field edge crowding and also increases the breakdown voltage. Positioning region 30 distance 34 from the edge of field oxide 40 also reduces the intensity of the electric field near the edge of oxide 40 and assists in improving the breakdown voltage. Spacing region 30 distance 32 from region 31 also reduces the electric field near the edge of oxide 40 and improves the breakdown voltage. Extending conductors 46 and 47 onto the respective portions of oxide 40 assists in reducing the electric field at the edge of oxide 40. Furthermore, extending conductor 49 to extend distance 50 past the edge of oxide 40 smoothes the electric field near the underlying edge of oxide 40. Similarly, extending conductor 60 past the edge of oxide 40 also smoothes the electric field near the underlying edge of oxide 40. Additionally, forming regions 36 and 37 to have a higher doping concentration than region 30 reduces the injection efficiency by suppressing minority carrier injection. Typically, the doping concentration of regions 36 and 37 is no greater than about one hundred (100) times the doping concentration of region 30. This provides diode 25 a fast switching time and also reduces both the substrate current and power drain. Adjustment of the doping concentrations of regions 30 and 31 along with spacing 32 minimizes the reverse leakage current and provides diode 25 a more ideal reverse leakage characteristic.

As will be appreciated by those skilled in the art, certain portions of diode 25 are scaled depending on the value of the desired breakdown voltage. Distances 38, 50, 62, and length 69 are selected based on the desired breakdown voltage. In one example embodiment, diode 25 is formed to have a breakdown voltage of no less than about seven hundred volts (700 V). For this example embodiment, distances 32, 34, 35, 44, 50, 61, 62, and length 69 were respectively about nineteen (19) microns, ten (10) microns, twelve (12) microns, seventy (70) microns, eleven (11) microns, 6.5 microns, twenty two (22), and eleven (11) microns. Also, the doping of regions 36 and 37 was about $1-2\times10^{17}$ atoms/cm$^3$ and region 39 had a doping concentration of about $1-2\times10^{16}$ atoms/cm$^3$. Additionally, conductors 46 and 47 and the associated insulators 41 and 42, regions 30, 31, and 39 are optional and may be omitted. Further, conductor 49 generally is a metal and may be a barrier metal that includes titanium/titanium-nitride layers.

In another example embodiment, diode 25 is formed to have a breakdown voltage of no less than about eight hundred fifty volts (850 V). For this example embodiment, distances 32, 34, 35, 44, 50, 61, 62, and length 69 were respectively about nineteen (19) microns, ten (10) microns, twelve (12) microns, one hundred (100) microns, eleven (11) microns, 6.5 microns, forty two (42), and thirty one (31) microns. Also, the doping of regions 36 and 37 was about $1-2\times10^{17}$ atoms/cm$^3$ and region 39 had a doping concentration of about $1-2\times10^{16}$ atoms/cm$^3$.

While the subject matter of the invention is described with specific preferred embodiments, it is evident that many alternatives and variations will be apparent to those skilled in the semiconductor arts. For example regions 36 and 37 may be spaced away from the Schottky junction. Region 29 may be formed in an epitaxial layer that is formed on a semiconductor substrate. The thickness of insulators 41 and 42 may be any selected value. Also, the words about or approximately mean that a value of an element has a parameter that is expected to be very close to a stated value or position. However, as is well known in the art there are always minor variances that prevent the values or positions from being exactly as stated. It is well established in the art that variances of up to about ten percent (10%) are regarded as reasonable variances from the ideal goal of exactly as described.

The invention claimed is:

1. A method of forming a Schottky diode comprising:
    forming a first region of a first conductivity type having a first doping concentration on a semiconductor substrate;
    forming a Schottky junction overlying a portion of the first region;
    forming a guard ring on the semiconductor substrate and surrounding an outside edge of the Schottky junction;
    forming an MOS gate overlying a surface of the semiconductor substrate and positioned between the guard ring and a portion of a field oxide region and
    forming a second doped region of the first conductivity type having a third doping concentration overlapping the first region and spaced a first distance from the first doped region, wherein the third doping concentration is greater than the first doping concentration.

2. The method of claim 1 further including forming a second doped region of the first conductivity type having a third doping concentration overlapping the first region and spaced a first distance from the first doped region, wherein the third doping concentration is greater than the first doping concentration.

3. A method of forming a Schottky diode comprising:
    forming a first region of a first conductivity type having a first doping concentration on a semiconductor substrate;
    forming a Schottky junction overlying a portion of the first region;
    forming a guard ring on the semiconductor substrate and surrounding an outside edge of the Schottky junction;
    forming an MOS gate overlying a surface of the semiconductor substrate and positioned between the guard ring and a portion of a field oxide region;
    forming a first doped region of the first conductivity type having a second doping concentration overlapping the first region including forming a conductor on the first doped region to form the Schottky junction wherein the second doping concentration is greater than the first doping concentration;
    forming a second doped region of the first conductivity type having a third doping concentration overlapping the first region and spaced a first distance from the first doped region, wherein the third doping concentration is greater than the first doping concentration;
    forming a third doped region of the first conductivity type within the second doped region and forming another conductor on the third doped region to form electrical contact thereto; and
    forming a fourth doped region of a second conductivity type having a fourth doping concentration within the second doped region and spaced a first distance from the third doped region.

4. The method of claim 2 wherein forming the first and second doped regions overlapping the first region includes forming the first region as a doped portion of the semiconductor substrate wherein the semiconductor substrate has a second conductivity type.

5. The method of claim 1 wherein forming the guard ring on the semiconductor substrate includes forming a first doped region of a second conductivity type on the semiconductor substrate and surrounding the outside edge of the Schottky junction.

6. A method of forming a Schottky diode comprising:
    providing a substrate of a first conductivity type having a first doping concentration;
    forming a first doped region of a second conductivity type having a second doping concentration on a surface of the substrate;
    forming a second doped region of the second conductivity type having a third doping concentration that is greater than the second doping concentration overlapping the first doped region;
    forming a Schottky junction overlying a portion of the first doped region and spaced apart from the second doped region; and
    forming a third doped region of the first conductivity type having a fourth doping concentration that is greater than the second doping concentration within the second doped region and spaced a first distance from the Schottky junction.

7. The method of claim 6 further including forming a fourth doped region of the second conductivity type having a fifth doping concentration overlapping the first doped region including forming a conductor on the first doped region to form the Schottky junction wherein the fifth doping concentration is greater than the second doping concentration.

8. The method of claim 7 further including a fifth doped region of the first conductivity type extending into the fourth doped region and surrounding the Schottky junction.

9. The method of claim 7 further including forming first and second field oxide regions on the substrate wherein the first field oxide region overlies a portion of the first doped region and wherein a portion of the second field oxide region overlies a portion of the fourth doped region; and forming an MOS gate surrounding the Schottky junction wherein the MOS gate is positioned between the Schottky junction and the first and second field oxide regions.

10. The method of claim 6 further including forming a fourth doped region of the second conductivity type within the second doped region and forming a conductor on the fourth doped region to form electrical contact thereto wherein the fourth doped region is spaced a second distance from the third doped region.

11. The method of claim 6 further including forming an MOS transistor on the substrate with the Schottky diode and spaced apart from the Schottky diode.

12. The method of claim 1 wherein forming the MOS gate includes forming the MOS gate overlying a portion of the guard ring.

13. The method of claim 12 further including forming a thin insulator of the MOS gate overlying an edge of the guard ring.

14. The method of claim 13 wherein the thin insulator extends from the field oxide region to overlie the edge of the guard ring.

15. The method of claim 6 wherein forming the Schottky junction overlying the portion of first doped region includes forming the Schottky junction spaced laterally apart from the second doped region.

16. The method of claim 6 further including forming a fourth doped region within the first doped region and underlying the Schottky junction.

17. The method of claim 16 further including forming the fourth doped region spaced laterally apart from the second doped region.

* * * * *